United States Patent Office 3,529,960

Patented Sept. 22, 1970

3,529,960

METHODS OF TREATING RESIST COATINGS

Hilbert Sloan, 5 Pomona Ave.,
Newark, N.J. 07112

No Drawing. Filed Jan. 24, 1967, Ser. No. 611,224
Int. Cl. G03c 5/00
U.S. Cl. 96—36 12 Claims

ABSTRACT OF THE DISCLOSURE

A substrate is coated with a resist composition comprising a curable, heat-sensitive resin composition in a vaporizable solvent or solvent mixture. The major portion of the solvent medium for the resist coating composition is gradually removed at a temperature sufficiently low to inhibit any curing of the resin as by air drying at room temperature. The coating thus dried is subjected to high vacuum drying in successive stages at gradually reduced pressures for periods sufficiently long and to a pressure sufficiently low to gradually remove residual solvent. The graduated high vacuum drying is accomplished at a temperature sufficiently low to inhibit curing of the resin and to maintain the integrity of the coating free of surface skinning, pinholes or blisters. As a result of such drying procedure, when the resin of the resist composition is thereafter cured, as with light, heat, by electron beam radiation, or by ion bombardment, the resist is firmly bonded to the substrate and the resist's physical and chemical characteristics are not degraded.

Resists are applied to substrates to protect a given or selected surface area from subsequent processing steps. The area unprotected by the resist may be altered or removed by physical, chemical or electrochemical means. It is desired that the areas protected by the resist shall be unaffected during the subsequent processing. Resists with which the present invention is concerned are of the kind comprising curable, heat-sensitive resin compositions which are applied as coatings in a solvent medium. Resists of this kind are used in many arts.

While the invention will be specifically described with reference to resists of the kind indicated above of the photosensitive type, the invention may be practiced with resist compositions which are not sensitive to light. Also, while the invention will be specifically described with regard to the manufacture of printed circuit boards, the methods of the invention furnish improved results wherever resist compositions of the kind indicated are used. The invention is useful to apply dyes to selected areas as described in Pat. No. 3,046,125; in the manufacture of color television tubes as described in the article by T. A. Saulnier entitled "Color-Television Screening, Electrochemical Technology," vol. 4, No. 1–2, January–February 1966, page 27; and in the manufacture of lithographic printing plates as described in Pat. Nos. 3,046,125 and 3,230,081. Also, the invention is applicable to a silk screening or printing technique wherein thermosetting resin ink resists are used. Further, the method of the invention may be practiced with regard to the known technique utilizing thermosetting resin resist compositions to effect what is known as "chemical milling." The methods of the invention contemplate a substrate of any suitable material, for example, any suitable metal, glass, ceramic, plastic material or plastic board, and may include heat-sensitive materials such as rubber or the like.

A negative photoresist is rendered insoluble on exposure to light. In general, negative photoresists of the kind under consideration comprise a polymer cross-linked or hardened by the action of light and an organic sensitizing agent. The sensitizing agent which increases the light sensitivity of the polymer, together with the polymer, are dissolved in an organic solvent or solvent mixture. A plasticizer may be added to make the dried photoresist more flexible. Chemical stabilizers may be added to protect the resin from oxidative degradation. Commonly used negative photoresist resin compositions comprise a light sensitive polymeric cinnamic acid ester and a sensitizing agent as disclosed in Pat. Nos. 2,670,285–6–7. The composition is made insoluble by exposure to ultraviolet radiation, the rate of insolubilization being increased by the organic sensitizing agent. By increasing the sensitivity value, the sensitivity of the polymer shifts to the visible portion of the spectrum. Sensitizing agents for the cinnamic acid esters include anthrone, benzanthrone, azabenzanthrone, and quinone compounds. These sensitizing agents increase the light sensitivity of the polymer over several hundred times. The sensitizer which is activated by light, activates the double bond of the cinnamyl groups of the polymer so that they undergo cross-linking. Those areas of the dried polymer which have been exposed to light and cross-linked become insoluble in the solvent system used to develop the exposed image. Cross-linking of sensitized photoresist resin compositions can also be accomplished by heat, electron beam bombardment, or by iron bombardment.

As disclosed in Pat. No. 3,169,868, polymers which are not in themselves light sensitive are also used to provide negative photoresist compositions. By adding a light sensitive material, such as a photopolymerizable benzoylazide compound to the polymer in solvent solution and applying the solution to form a thin film, the entire film becomes a photoresist. On exposing the dried film to light, the exposed sensitizer insolubilizes the polymer so that it is not washed out in a developing solution. The cross-linking of the sensitizer forms a cage-like structure which entraps the normally light insensitive polymer to render it insoluble in the developing solution. Compositions of this type and techniques for processing such compositions are disclosed in Pat. Nos. 3,143,423 and 3,169,868.

In photofabrication with negative photoresists of the types above indicated, it has been the practice to dissolve the curable, heat-sensitive, photoresist resin composition in a vaporizable solvent and to apply the composition to a given surface by dipping, spraying, whirling, or by roller coating. The thickness of the coating may vary from a few millionths to several thousandths of an inch depending upon the requirements of subsequent processing. The photoresist coating is allowed to air dry for ten to thirty minutes after which it is usually heat dried in a recirculating oven for approximately fifteen to thirty minutes. The oven temperature is kept sufficiently low to prevent the polymer of the photoresist composition from cross-linking and becoming polymerized. If the photoresist coating is heated at too high a temperature, it begins to polymerize as soon as the solvent is removed. A partially polymerized film is not very sensitive to a wide range of light intensities. Where the substrate is a metal surface, the photoresist compositions have been dried by infrared and high frequency induction heating of the metal. In any event, the dried, uncured photoresist is then exposed to a suitable light source through an appropriate mask.

The light must be of sufficient time and intensity to polymerize and bond the photoresist to the substrate. The light source can be a tungsten lamp, mercury vapor lamp, fluorescent tube, or carbon arc. The desired image may also be exposed by projection of a focused light or electron beam onto the dried photoresist coating. A moving projected light or electron beam can be used to trace out the desired image in the photoresist. In the chemical developing step, the exposed resist is left intact while the unexposed portions are dissolved out with solvents. After developing, the desired photoresist exposed pattern remains bonded to the substrate surface as a protective coating. All other surface areas are now free of photoresist and can be modified by chemical or physical means.

The chemical and physical characteristics of the applied photoresist determine the quality of an item manufactured by photofabrication techniques. Improperly dried photoresist films are responsible for many manufacturing problems and a high rate of rejects. These problems include a restriction in the usable light intensity range because of over-drying or under-drying, pinhole formation in the coating and poor adhesion to the base material or substrate of the developed resist pattern.

The exposure characteristics of a photoresist are related to how it is dried, and this is true whether the photoresist is of a negative or positive type. Incomplete drying causes poor adhesion of the exposed resist to the substrate. With a partially dried photoresist, much of the light energy in the exposure operation is used up in drying out the retained solvent from the resist rather than cross-linking it and bonding it to the substrate. Diffusion of retained solvent to the boundary line decreases the adhesion of the photoresist film while the resist is being exposed. Poor adhesion of the photoresist allows the developing solution to distort or wash out the exposed pattern. Poor adhesion also allows the etching solution to peel or lift the edges of the resist away from the substrate. This causes severe undercutting of the material below the resist. Where the adhesion of the resist is poor, the etching solution separates the photoresist from its substrate and attacks adjoining areas of the substrate which it is desired to protect. Pinholes are easily formed in partially dried photoresist films during exposing and developing. Light normally used to harden the photoresist undesirably acts to evaporate the retained solvent. This leaves soft spots in the resist film which are readily dissolved out in the developing operation.

Tests made with air dried negative photoresists have shown that pinholing in the photoresist film is not eliminated though subjected to air drying for as long as one hundred hours. The adhesion of an air dried photoresist film to the substrate is marginal. It is difficult to get rid of the last traces of solvent in a photoresist by air drying.

When a negative photoresist is oven dried, the residual solvent is vaporized and diffuses toward all surfaces of the resist film or coating. However, in the process of diffusion, volatile solvents also diffuse toward the boundary line of the substrate and the adjacent resist film. This causes a weakening in the adhesion of the resist film to the substrate. If the heat is applied at a relatively high temperature, surface skinning of the photoresist film is caused. This result obtains because the polymer begins to cross-link at the dried surface while the interior of the film still contains residual solvent. Surface skinning causes solvent blisters and pinholes to form in the resist film as the heated solvents are vaporized. Also, there is a weakening of the adhesion of the resist to the substrate due to the blocking of the free movement of the solvent out of the top surface of the film, thereby forcing the solvent down to the boundary line. The application of relatively high temperature to the resist film also restricts the workable light intensity range by initiating cross-linking prior to exposure. Incompletely dried photoresist films have poor sensitivity to light since much of the light is used up in drying out the film.

Photoresists of the positive type and comprising a curable, heat-sensitive resin in a vaporizable solvent or solvent mixture present the same problem in processing as photoresists of the negative type. Positive photoresists of the type herein contemplated are disclosed, for example, in Pat. No. 2,766,118 and comprise a non-hardenable alkali soluble phenol formaldehyde novalac resin and a substituted diazo compound which is light-sensitive. Upon exposure to light, the diazo compound breaks down and becomes soluble in an aqueous alkaline solution.

In photofabrication with positive photoresists comprising a curable, heat-sensitive resin composition, the composition is dissolved in a vaporizable solvent or solvents and applied to a substrate by dipping, spraying, whirling or roller coating. Areas of the surface to be worked are exposed to light. The developing solution dissolves out the exposed areas leaving the unexposed portions of the resist film bonded to the substrate. Incomplete drying causes poor adhesion of the film to the substrate. Underdrying will cause the unexposed resist to become partially soluble in the developing solution. Drying by heat causes solvent to diffuse down to the boundary line and weakens adhesion.

Negative and positive photoresist compositions of the types hereinbefore described are used to manufacture printed circuit boards. In the case of a curable, heat-sensitive resin composition of the negative photoresist type, the composition in a vaporizable solvent or solvent mixture is applied to a clean copper-clad laminate. The coating is air dried at room temperature for approximately thirty minutes to remove the solvent. A negative of the desired circuit pattern is applied to the photoresist coated board and held in intimate contact in a vacuum frame. The photoresist is exposed to a light source through a negative to cure the resin. The photoresist may also be exposed by optical projection of the circuit pattern through a mask using a collimated light beam. The resist is then developed in a hot spray, trichlor vapor degreaser, for about one minute. During this stage, the unexposed photoresist is removed from the copper laminate or substrate. The exposed copper is then etched out with ammonium persulfate, ferric chloride or some other etchant. The printed circuit which remains on the board is protected from the etching solution by the overlying, cured photoresist. The photoresist is then removed from the circuit lines by chemical stripping, or by scrubbing with power brushes.

Where a printed circuit board is made with a curable, heat-sensitive resin composition of the positive photoresist type, the composition in a vaporizable solvent or solvents is applied to a clean copper laminate. The coating is air dried and then oven dried at approximately 150° F. to remove the solvent. A positive of the desired circuit pattern is applied to the photoresist coated board and held in intimate contact in a vacuum frame. The photoresist is exposed to a light source through the positive print to solubilize the exposed resist. The resist is developed in an aqueous alkaline solution. During this stage, the exposed photoresist is removed from the copper laminate. The exposed copper is then etched out with a chemical etchant. The printed circuit which remains on the board has been covered by the unexposed photoresist to protect the circuit from the etching solution.

The prior art methods of drying photoresists of the kind indicated, whether of the negative or positive positive types, is accomplished by air drying, oven drying, infrared drying, high frequency induction heating, or ordinary vacuum drying. With such methods it is practically impossible to ascertain whether the drying operation removes all of the solvent, and it is practically impossible to remove the solvent while still maintaining the desired integrity of the photoresist film or coating without loss or degradation of its physical and chemical characteristics.

The photoresist film when dried in accordance with the prior art practices is either incompletely dried or overdried.

The following described experiments demonstrate the affect of various drying methods in accordance with the practices prior to the present invention. All conditions were kept constant except exposure light intensity. The sensitivity of the photoresist film, dried by the different methods, was compared by varying the light intensity on different substrates or boards. The exposed lines were 10 mils wide. The exposure time was fixed at 0.02 second for all experiments. A mercury vapor lamp was used as a light source during exposure of the photoresist. The light intensity from the lamp was measured by a light intensity meter which read from a low of 5 to a high of 15. The light intensity of the lamp was controlled by adjusting the current to the lamp. A light setting, ranging between 7.6 to 8.4 was used on the heat dried or infrared dried photoresist coated boards. The photoresist used in the experiments was of the negative type, specifically comprising a composition of 8% by weight of beta-styrylacrylic acid polyester of polyvinyl alcohol dissolved in a solvent mixture of n-butylacetate, chlorobenzene and cyclohexanone. The thickness of the dried photoresist coating varied from 50 to 100 millionths of an inch. If the light sensitivity value was below a range of 7.6–8.4, the possibility existed that the incompletely dried photoresist resin film would be underexposed and that the exposed photoresist lines would therefore wash out in the developing solution. This condition was frequently encountered when using lower light intensity values.

On the other hand, when the light intensity setting was higher than within the range of 7.6 to 8.4, there was overexposure of the photoresist. This occurred when the photoresist was partially cured in the drying operation. An overexposed resist resulted in wider lines and bridging of the photoresist between adjacent exposed lines. Thus, a slight amount of light scattering during exposure with a higher light intensity on an oven-dried photoresist was sufficient to cross-link the photoresist on both sides of the exposed area. Where the lines were close together, or less than 10 mils apart, the scattered light from each line was reinforced by the scattered light from the adjacent line and resulted in cross-linking or bridging of the photoresist between the lines.

The difficult in removing retained solvents was demonstrated by the following described experiment. A number of copper laminated boards were coated with approximately 50 millionths of an inch of a negative photoresist of the composition above described and in the above described mixture of solvents. The coatings were air-dried for three days at room temperature. The coated boards were then placed in a vacuum chamber and held at 1 mm. of mercury for eight hours with a vacuum pump running continuously. The temperature in the vacuum chamber was maintained at 90° F. The boards were then removed, placed in a tightly closed container and left standing for twenty-four hours. When the container lid was removed, a solvent odor was readily detected. The solvent had slowly diffused out of the supposedly dried photoresist film and was contained by the closed container. The photoresist coated boards were then exposed for 0.02 second at a light intensity setting of 7.6–8.4. Adhesion of the exposed photoresist to the copper base material was marginal and resulted in some slough off in the developing operation. Appreciable undercutting of the 10 mil lines were apparent.

I have determined that the sensitivity of the photoresist film over a wide range of light intensities, accompanied by the attainment of a firm bond of the film to a substrate, together with the elimination of the problems of surface skinning, pinholding and solvent blisters, may be simply achieved. The major portion of the solvent or solvents for the curable, heat-sensitive resin resist composition applied to a substrate is gradually removed at a temperature sufficiently low to inhibit any curing of the resin. This may be accomplished by air drying or vacuum drying in the absence of heat. Then, and also in the absence of heat, the photoresist film so dried is subjected to successive stages of high vacuum drying at gradually reduced pressures to a pressure sufficiently low for periods of sufficiently long duration to gradually remove residual solvent. Generally, the last stage of vacuum drying is $1\times10^{-4}$ mm. of mercury or lower. The measure of the negative pressure at the last stage depends upon the particular solvent or solvents. In any event, the temperature throughout the stages of high vacuum drying is also maintained sufficiently low to inhibit any curing of the resin.

In greater detail, the curable, heat-sensitive resin resist composition in a vaporizable solvent is applied by standard methods. The coating thickness may vary from a few millionths to several thousandths of an inch. The resist is allowed to air dry for approximately twelve hours to permit the bulk or the major portion of the solvent to evaporate from the coating. The resist coated parts are placed in a high vacuum chamber fitted with a cold trap. The vacuum is applied slowly and in stages as follows: to 1.0 mm. mercury for 10 minutes, to 0.1 mm. for ten minutes, to 0.01 mm. for ten minutes, to 0.001 mm. for ten minutes, and to 0.0001 mm. for ten minutes. This gradual increase in vacuum or reduction in pressure is for the purpose of slowly distilling off the major portion of the residual solvent. A rapid flash-off of solvent under high vacuum conditions would cause solvent blistering and pinholing in the photoresist film. After the easily evaporated solvents are removed, a high vacuum ranging from about $1\times10^{-6}$ mm. of mercury is employed to remove the last traces of residual solvents and moisture from the photoresist film.

The removal of the last trace of solvents may be monitored with a mass spectrometer which analyzes the presence of vaporizable material in a vacuum chamber. When all the residual solvents and water vapor have been removed, as indicated by the mass spectrometer, the vacuum is then released. Mass spectrometer analysis is only required for the initial vacuum drying stages to determine the length of time necessary to remove given solvents. The entire time required for the vacuum drying cycle usually varies from approximately 1 to 2 hours depending upon the solvent or solvents to be removed and the thickness of the photoresist coating. The resist coated parts dried in the manner described are then processed in the same manner as has been the practice in the art. A desired pattern is exposed on the resist coating dried as aforesaid, the image is developed and the part subjected to the usual operations, as for example, chemical etching.

For the manufacture of printed circuit boards, the substrate or copper laminated boards were coated with fifty millionths of an inch of a composition of the type comprising 8% by weight of beta-styrylacrylic acid polyester of polyvinyl alcohol dissolved in a solvent mixture of n-butylacetate, chlorobenzene and cyclohexanone. The coatings were air dried for twenty-four hours to remove the bulk of the solvents. The boards thus coated and dried were placed in a high vacuum chamber and slowly brought down, in stages and over a period of fifty minutes, to a vacuum of $1\times10^{-5}$ mm. of mercury. Removal of the residual solvent from the resist coating was monitored with a mass spectrometer. After one hour, the reading on the mass spectrometer indicated that all the residual solvent and moisture had been removed. The coated boards were then removed from the vacuum chamber and a printed circuit pattern was exposed on them. They were exposed for 0.02 second at a light intensity setting ranging from a low of 5 to a hight of 15 on the light intensity meter to cure the resist to a substantial extent. Thus, each board was exposed at a different light intensity. The boards were all developed in a hot spray, trichlor vapor, degreaser for thirty seconds. The exposed copper when then etched out in a Chemcut etcher using an ammonium persulfate etching solution. Adhesion of the exposed and developed photoresist to the copper substrate was excellent for all light intensity settings. There were substantially no pinholes in the photoresist film. Undercutting of the exposed 10 mil lines was limited to approximately 1 mil on each side. Bridging of the photoresist did not occur even at light intensities of 15. As a result, there was no copper bridging between the circuit lines after etching.

For many applications, completion of curing upon exposure is not essential, for example, to etch wide lines. For other applications involving fine line work, to one mil or less, or where the resist must withstand hot alkaline or oxidizing etchants, it is necessary that the resist be fully cured with maximum adhesion to the substrate. Such results may be obtained by vacuum drying the exposed resist after developing. In the developing operation, the exposed photoresist may be softened or swelled by the usual developing solvents. Applying heat to remove the adsorbed solvent weakens the adhesion of the resist to the substrate. All of the adsorbed solvents are removed by a second high vacuum drying procedure to a negative pressure of at least $1 \times 10^{-4}$ mm. mercury in the absence of heat. The resist can then be completely hardened or cured in any desired manner.

As previously indicated, it is within the scope of the invention to use electron beam radiation curing. Electron beam radiation curing utilizes a beam of electrons and enables curing the resin in a few seconds at room temperature. The advantage of this mode of curing is that since heat is eliminated, thermal or heat-sensitive substrates such as certain plastics and rubber may be coated with a curable, resin resist composition and processed without damage to the substrate. Equipment for radiation curing is commercially available; for example, Radiation Polymer Corp., Plainfield, Ill.

Resist coated substrates dried in the manner as above described provide superior adhesion of the resist to a substrate during plating operations. This enables the manufacture of additive printed circuits having very sharp line definition.

It is believed that the advantages and improved results provided by the methods of the invention will be apparent from the foregoing detailed description. Various modifications and changes may be made without departing from the spirit and scope of the invention as set forth in the following claims.

I claim:

1. A method for improving the adhesion of a resist composition to a substrate and for maintaining the characteristics of the resist composition, the method comprising applying to a substrate a coating of a curable, radiation-and heat-sensitive resin resist composition in a vaporizable solvent, gradually removing the major portion of the solvent at a temperature sufficiently low to inhibit curing of the resin, and subjecting the coating treated as aforesaid to successive stages of vacuum drying at gradually reduced pressures to a pressure sufficiently low for periods of sufficiently long duration to gradually remove residual solvent and to prevent surface skinning of the coating and the formation of blisters and pinholes, the temperature throughout the stages of vacuum drying being sufficiently low to inhibit curing of the resin, exposing the coating thus treated to a source of radiation to form a pattern thereon, developing the coating, etching out the substrate at selected areas, and removing the resist.

2. A method as set forth in claim 1, wherein the final stage of vacuum drying is at least $1 \times 10^{-4}$ mm. of mercury.

3. A method as set forth in claim 1, wherein following the gradual removal of the major portion of the solvent, the successive stages of vacuum drying are accomplished as follows: to approximately 1.0 mm. of mercury for approximately ten minutes, to approximately 0.1 mm. of mercury for approximately ten minutes, to approximately 0.01 mm. of mercury for approximately ten minutes, to approximately 0.001 of mercury for approximately ten minutes, to approximately 0.0001 of mercury for approximately ten minutes, followed by a vacuum of at least $1 \times 10^{-4}$ mm. of mercury for a period sufficiently long to remove the last traces of residual solvent.

4. A method for photofabrication comprising coating a substrate with a curable, heat-sensitive, photosensitive resin resist composition in a vaporizable solvent, gradually removing the major portion of the solvent at a temperature sufficiently low to inhibit curing of the resin, subjecting the coating treated as aforesaid, in the absence of heat, to high vacuum drying in successive stages at gradually reduced pressures down to a pressure sufficiently low for periods of sufficiently long duration to gradually remove residual solvent, exposing the coating thus treated to a light source to form a pattern thereon, developing the coating, etching out the substrate at selected areas, and removing the resist.

5. A method as set forth in claim 4, wherein the curable, heat-sensitive, photosensitive resin resist composition is selected from the group consisting of negative and positive photoresists.

6. A method as set forth in claim 4, wherein the final stage of vacuum drying is at least $1 \times 10^{-4}$ mm. of mercury.

7. A method for photofabrication comprising coating a substrate with a curable, heat-sensitive, photonegative resin resist composition in a vaporizable solvent, gradually removing the major portion of the solvent at a temperature sufficiently low to inhibit curing of the resin, subjecting the coating treated as aforesaid, in the absence of heat, to high vacuum drying in successive stages at gradually reduced pressures down to a pressure sufficiently low for periods of sufficiently long duration to gradually remove residual solvent, exposing the coating thus treated to a light source to form a pattern thereon and to at least partially cure the coating, developing the coating, etching out the substrate at selected areas, and removing the resist.

8. A method as set forth in claim 7, wherein the final stage of vacuum drying is at least $1 \times 10^{-4}$ mm. of mercury.

9. A method as set forth in claim 7, wherein after the developing step the coating is again subjected to high vacuum drying to remove adsorbed developing solvent from the exposed photonegative resist coating and then fully curing the thus dried coating.

10. A method as set forth in claim 7, wherein both high vacuum drying operations at their respective final stages are at least $1 \times 10^{-4}$ mm. of mercury.

11. A method as set forth in claim 4, wherein following the gradual removal of the major portion of the solvent, the successive stages of vacuum drying are accomplished as follows: to approximately 1.0 mm. of mercury for approximately ten minutes, to approximately 0.1 mm. of mercury for approximately ten minutes, to approximately 0.01 mm. of mercury for approximately ten minutes, to approximately 0.001 of mercury for approximately ten minutes, to approximately 0.0001 of mercury for approximately ten minutes, followed by a vacuum of at least $1 \times 10^{-4}$ mm. of mercury for a period sufficiently long to remove the last traces of residual solvent.

12. A method as set forth in claim 7, wherein following the gradual removal of the major portion of the solvent, the successive stages of vacuum drying are accomplished as follows: to approximately 1.0 mm. of mercury for approximately ten minutes, to approximately 0.1 mm. of mercury for approximately ten minutes, to approximately 0.01 mm. of mercury for approximately ten minutes, to approximately 0.001 of mercury for approximately ten minutes, to approximately 0.0001 of mercury for approximately ten minutes, followed by a vacuum of at least $1 \times 10^{-4}$ mm. of mercury for a period sufficiently long to remove the last traces of residual solvent.

References Cited

UNITED STATES PATENTS

| | | | |
|---|---|---|---|
| 1,861,918 | 6/1932 | Hickman | 34—16 |
| 2,115,747 | 5/1938 | Rafton | 34—16 |

| | | | |
|---|---|---|---|
| 2,959,486 | 11/1960 | Strashun et al. | 99—204 |
| 3,046,125 | 7/1962 | Wainer | 96—36 |
| 3,386,826 | 6/1968 | Aebi et al. | 117—34 |

NORMAN G. TORCHIN, Primary Examiner

J. R. HIGHTOWER, Assistant Examiner

U.S. Cl. X.R.

96—115